United States Patent [19]

Hiroshi et al.

[11] Patent Number: 4,885,602
[45] Date of Patent: Dec. 5, 1989

[54] EXPOSURE SYSTEM FOR PHOTO-SENSITIVE RECORDING MEDIUM

[75] Inventors: Kawahara Hiroshi, Nishikasugai; Sakakibara Kenji, Ichinomiya, both of Japan

[73] Assignee: Brother Kogyo Kabushiki Kaisha, Aichi, Japan

[21] Appl. No.: 264,149

[22] Filed: Oct. 28, 1988

[30] Foreign Application Priority Data

Oct. 30, 1987 [JP] Japan ............................ 62-167112[U]

[51] Int. Cl.$^4$ ............................................. G03B 27/32
[52] U.S. Cl. .......................................... 355/27; 355/32
[58] Field of Search ...................... 355/71, 67, 27, 28, 355/29, 32, 35–38, 43, 49, 57

[56] References Cited

U.S. PATENT DOCUMENTS

| 2,698,561 | 1/1955 | Crowell | 355/71 |
|---|---|---|---|
| 3,811,770 | 5/1974 | Baus, Jr. et al. | 355/67 |
| 4,806,982 | 2/1989 | Yamamoto et al. | 355/45 |
| 4,806,984 | 2/1989 | Asano | 355/32 |

Primary Examiner—L. T. Hix
Assistant Examiner—Khanh Dang
Attorney, Agent, or Firm—Kane, Dalsimer, Sullivan, Kurucz, Levy, Eisele and Richard

[57] ABSTRACT

In an exposure system, a photo-sensitive recording medium rests on a resting surface of a table. The recording medium on the resting surface is illuminated with light from a light source and is exposed to the light. The resting surface has reflectivity which is so determined as to increase from a central region of the resting surface gradually toward opposite end regions thereof in such a manner that a sum of a quantity of the light from the light source, with which the recording medium is illuminated directly, and a quantity of light transmitted through the recording medium and reflected by the resting surface, with which the recording medium is illuminated indirectly, is made substantially uniform over the entire surface of the recording medium.

13 Claims, 3 Drawing Sheets

EXPOSURE SYSTEM FOR PHOTO-SENSITIVE RECORDING MEDIUM

BACKGROUND OF THE INVENTION

This invention relates generally to an image recording apparatus such as an optical printer, a copying machine or the like of type utilizing a photo-sensitive recording medium, and more particularly, to an exposure system for the photo-sensitive recording medium.

Referring to FIG. 1 of the drawings, there is schematically shown a usual of general copying machine for copying image information on an original to a photo-sensitive recording medium. The copying machine comprises a transparent glass platen 51 movable in a direction indicated by an arrow A. An original 52 having carried thereon image information is placed upon the platen 51. Light from a light source 53 scans the information side of the original 52, while the original 52 as well as the platen 51 is moved in the arrowed direction A. Light reflected by the original 51 is directed toward a photo-sensitive recording medium 54 transported in a direction indicated by an arrow B, so that the recording medium 54 is exposed to the light. The recording medium 54 is then developed by a pressure developing unit 55.

For the arrangement illustrated in FIG. 1, it is required that the recording medium 54 is exposed to the light while being maintained horizontal. To this end, in general, a table 56 is provided for enabling the recording medium 54 to rest upon an upper surface or a resting surface of the table 56. The recording medium 54 moves in sliding contact with the resting surface of the table 56.

Usually, the resting surface of the table 56 is formed into a mirror surface or a white surface for the following reason. That is, the light transmitted through the recording medium 54 is reflected by the resting surface of the table 56, and the recording medium 54 is again exposed to the reflected light from the back side of the recording medium 54, thereby utilizing the light quantity effectively.

In connection with the above, the light emitted from the light source 53, reflected by the information side of the original 52 and shining upon the recording medium 54 at the exposure has such a deviation that the light quantity at each of opposite end regions on the recording medium 54 in the main scanning direction is less than that at a central region on the recording medium 54. As a consequence, when the recording medium 54 is exposed to the light, the central region on the recording medium 54 is exposed sufficiently to the light, but the opposite end regions on the recording medium 54 become insufficient in exposure. When the exposed recording medium 54 is developed by the pressure developing unit 55, an exposure difference tends to occur between the central region and the opposite end regions of the recording medium 54.

In order to compensate for the exposure difference, such a measure has usually and conventionally been taken that a slit 57 is arranged immediately above the recording medium 54. The slit 57 is narrow at its longitudinally central region, but is wide at opposite end regions, thereby correcting the light quantity distribution.

In the conventional exposure system, however, provision of the slit for correcting the deviation in the exposure quantity with respect to the recording medium complicates the construction and increases the number of component parts, resulting in an increase in the cost.

SUMMARY OF THE INVENTION

It is therefore an object of this invention to provide an improved exposure system for a photo-sensitive recording medium, capable of achieving correction of an exposure quantity distribution by the use of a resting surface of table means on which the recording medium rests, thereby making it possible to simplify the construction, to reduce the cost, and to form an image of high quality quickly.

For the above purpose, according to the invention, there is provided an exposure system for a photo-sensitive recording medium, which comprises light source means for emitting light and table means having a resting surface on which the recording medium rests, wherein the recording medium on the resting surface of the table means is illuminated with the light from the light source means and is exposed to the light, and wherein the resting surface of the table means has reflectivity which is so determined as to increase from a central region of the resting surface gradually toward opposite end regions thereof in such a manner that a sum of a quantity of the light from the light source means, with which the recording medium is illuminated directly, and a quantity of light transmitted through the recording medium and reflected by the resting surface of the table means, with which the recording medium is illuminated indirectly, is made substantially uniform over an entire surface of the recording medium.

With the arrangement of the exposure system according to the invention, the recording medium is illuminated with the light from the light source means and, subsequently, the light transmitted through the recording medium is reflected by the resting surface of the table means below the recording medium. The recording medium is again exposed to the reflected light from the back side of the recording medium. At this time, the quantity of light to which the front side of the recording medium is exposed is not uniform, but has a certain distribution. Since, however, the reflectivity of the resting surface of the table means increases from the central region gradually toward the opposite end regions so as to be capable of correcting the distribution of the light quantity exposing the recording medium from the front side thereof, the sum of the light quantity exposing the recording medium directly from the front side thereof and the light quantity exposing the recording medium indirectly from the back side thereof is made uniform over the entire surface of the recording medium, making it possible to achieve the correction of the light quantity distribution.

BRIEF DESCRIPTION OF THE ACCOMPANYING DRAWINGS

DESCRIPTION OF THE EMBODIMENTS

Figure 1:
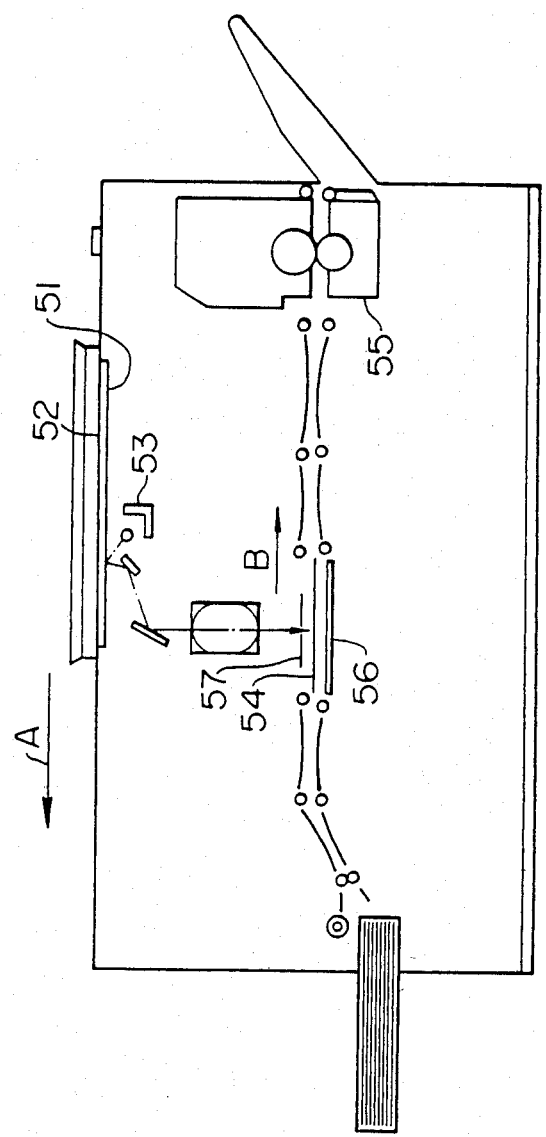
FIG. 1 is a schematic cross-sectional view of a usual or general copying machine having incorporated therein a conventional exposure system.
Figure 2:
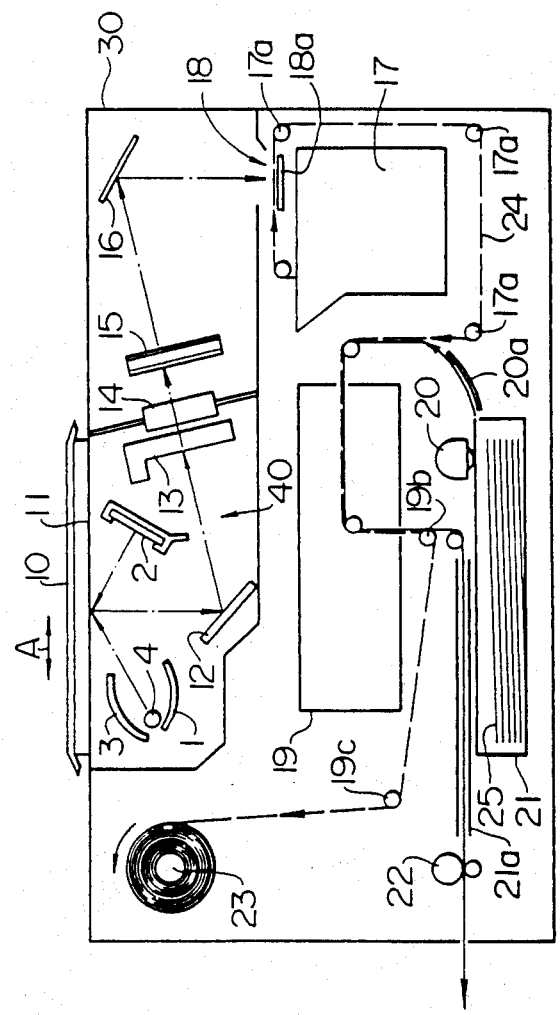
FIG. 2 is a schematic cross-sectional view of a color copying machine having incorporated therein an exposure system embodying the invention.

Referring to FIG. 2, there is schematically shown in cross-section a color copying machine having incorporated therein an exposure system embodying the invention. The copying machine is of type which utilizes a color compatible photo and pressure sensitive recording medium disclosed in U.S. Pat. No. 4,399,209. The recording medium is composed of a continuous web and a developing sheet. The continuous web is coated with microcapsules each containing dye precursor. The developing sheet is coated with developer. It is to be understood, however, that any other suitable photo and pressure sensitive recording media can be employed in the copying machine.

As shown in FIG. 2, the copying machine comprises a body 30. A transparent glass platen 11 is mounted to the top of the body 30 and can be covered with a platen cover 10. An original is set between the platen 11 and the platen cover 10 in such a manner that a side of the original having carried thereon image information faces downwardly. At exposure subsequently to be described, the platen 11 as well as the platen cover 10 is reciprocatively moved together with the original in a direction indicated by an arrow A in FIG. 2.

An exposure system, generally designated by the reference numeral 40, includes a light source 4 arranged below the platen 11, for emitting light in the form of a line extending perpendicularly to the direction A. The original is illuminated with the light from the light source 4. A reflector 1 is arranged below the light source 4, and is formed by a cold mirror having such a characteristic that visible radiation is reflected by the cold mirror, but infrared radiation is transmitted through the cold mirror. The reflector 1 has its parabolic cross-sectional shape. A reflector 3 is arranged just above the reflector 1 in facing relation to the same. The reflector 3 is formed by an aluminum mirror, and has a parabolic cross-sectional shape. The light source 4 is arranged between the pair of reflectors 1 and 3 and is located at a focus common to them. A reflector 2 is arranged below the platen 11 and at a location on the right of the light source 4. The reflector 2 is formed by a flat cold mirror for reflecting a part of the light emitted from the light source 4, which is not directed toward the original, and for reflecting only the visible radiation of the light reflected by the reflector 3, to cause the reflected light part and the reflected visible to shine upon the information side of the original. By the reflectors 1, 2 and 3 constructed as above, the light source 4 shines upon a predetermined line on the information side of the original, which extends perpendicularly to the arrowed direction A.

When, at exposure subsequently to be described, the platen 11 as well as the platen cover 10 is reciprocatively moved together with the original by a moving mechanism (not shown) in the arrowed direction A, the information side of the original passes successively over the predetermined line illuminated with the light from the light source 4.

Below the predetermined line, a reflecting mirror 12 is arranged for directing the light reflected from the predetermined line, toward a right upper location within the body 30. At a location on the right of the reflecting mirror 12, a shutter 13 is arranged for suitably intercepting or passing the light reflected by the reflecting mirror 12. A lens system 14 is arranged on the right of the shutter 13. In the right of the lens system 14, a filter 15 is arranged permitting predetermined wavelength components for respective cyan, magenta and yellow, to be transmitted selectively through the filter 15. At a right upper location within the body 30, a reflecting mirror 16 is arranged for reflecting downwardly the light having passed through the filter 15.

Below the reflecting mirror 16, an exposure station 18 is arranged for exposing a portion of a continuous web 24 to the light reflected by the reflecting mirror 16. The exposure station 18 includes a table 18a having an upper reflecting surface or a resting surface on which the web 24 rests in such a manner that the web 24 can be transported across the resting surface of the table 18a. The resting surface of the table 18a is formed into a mirror surface or a white surface. Below the exposure station 18, a cartridge or Patrone 17 is arranged for accommodating therein an unused portion of the web 20 wound into a roll. A plurality of web feed rollers 17a are arranged around the web cartridge 17 for feeding the web 24. The web 24 is transported around the cartridge 17 by the web feed rollers 17a, and is conveyed to a pressure developing unit 19 which is arranged on the left of the cartridge 17. When the web 24 is transported, the original moves together with the platen 11 in synchronism with the transportation of the web 24. Thus, a latent image corresponding to the image information on the original is formed onto the portion of the web 20 at the exposure station 18.

Below the pressure developing unit 19, a sheet cartridge 21 is arranged which accommodates therein a stack of developing sheets 25 of cut sheet type. Above the sheet cartridge 21, a roller 20 is arranged for drawing the developing sheets 25 one by one out of the sheet cartridge 21. The drawn developing sheet 25 is fed along a sheet feed guide 20a toward the web cartridge 17. The developing sheet 25 is brought into close contact with the portion of the web 24 having carried thereon the latent image. That is, the developing sheet 25 and the web 24 are superimposed one upon the other and are transported toward the pressure developing unit 19 for developing the latent image on the portion of the web 24, onto the developing sheet 25. In this connection, the pressure developing unit 19 employed in the illustration embodiment has no direct relation to the invention, and the detailed description of the pressure developing unit 19 is therefore omitted here.

The superimposed web and sheet 24 and 25 are transported downwardly out of the pressure developing unit 19, and are separated from each other by a separator roll 19b arranged below the pressure developing unit 19. The thus separated web 24 is transported upwardly by a guide roller 19c arranged on the left of the separator roll 19b. The used portion of the web 24 is wound around a take-up roller 23 arranged at a left upper location within the body 30. On the other hand, the separated developing sheet 25 is transported to the left along a sheet guide 21a arranged above the sheet cartridge 21. On the left of the sheet guide 21a, a heat-fixing unit 22 is arranged for giving a gloss to the developed image formed on the developing sheet 25. The developing sheet 25 having passed through the heat-fixing unit 22 is discharged out of the body 30.

The operation of the copying machine constructed as above will be described below.

When the original placed upon the platen 11 is stationary at an initial position, the light from the light source 4 shines upon the predetermined line on the original through the reflectors 1, 2 and 3. The light reflected by the original is directed to the right by the reflecting mirror 12 and is caused to pass through the shutter 13, the lens system 14 and the filter 15. The light having passed through the filter 15 is reflected downwardly by the reflecting mirror 16, and exposes the portion of the web 24 placed upon the table 18a of the exposure station 18.

As the platen 11 starts to move together with the original and the platen cover 10 in the arrowed direction A, the web 24 starts to be transported by the rollers 17a around the web cartridge 17.

After completion of the movement of the original, a latent image corresponding to the image information on the original is formed onto the portion of the web 24. The length of the portion of the web 24 arranged around the web cartridge 17 is set to a value at least equal to that of the original placed upon the platen 11. The portion of the web 24 having carried thereon the latent image is superimposed upon the developing sheet 25 drawn out of the sheet cartridge 21 along the sheet guide 20a. The superimposed web and sheet 24 and 25 are fed into the pressure developing unit 19. At the pressure developing unit 19, unexposed brittle microcapsules on the portion of the web 24 are ruptured so that the dye precursors are squeezed out of the ruptured microcapsules. The dye precursors squeezed out of the ruptured microcapsules react with the developer coated on the developing sheet 25 so that the latent image on the web 24 is developed onto the developing sheet 25. Thus, a color image is formed on the developing sheet 25.

The web and developing sheet 24 and 25 discharged out of the pressure developing unit 19 are separated by the separator roll 19b. The thus separated web 24 is transported upwardly by the guide roller 19c and is wound up around the take-up roller 23. On the other hand, the separated developing sheet 25 is transported to the left and is caused to pass through the heat-fixing unit 22. By passage through the heat-fixing unit 22, color development of the image on the developing sheet 25 is accelerated, and a gloss is given to the image. Subsequently, the developing sheet 25 is discharged out of the body 30.

Figure 3:
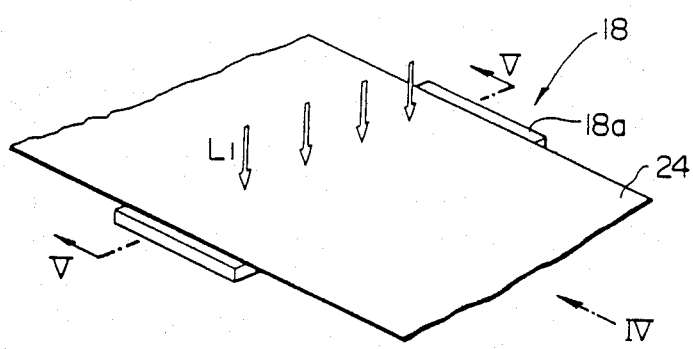
FIG. 3 is a fragmentary enlarged perspective view of an exposure station illustrated in FIG. 2.
Figure 4:
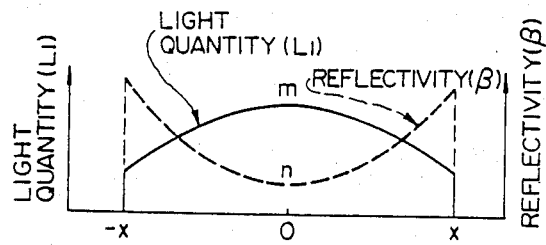
FIG. 4 is a graphical representation of the relationship between a light quantity of reflecting light (primary light) from an original and reflectivity of a resting surface of a table, as viewed from the arrow IV in FIG. 3.
Figure 5:
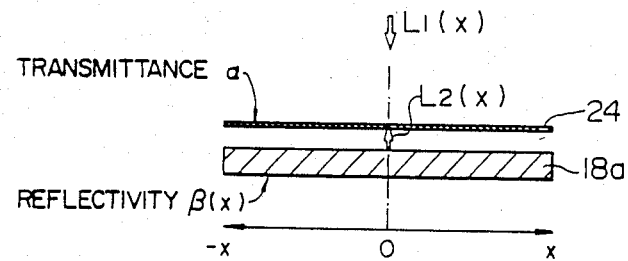
FIG. 5 is a cross-sectional view taken along the line V—V in FIG. 3.

The above-mentioned exposure station 18 will be described in detail with reference to FIGS. 3 through 5. FIG. 3 is a perspective view of the exposure station 18. FIG. 4 is a graphical representation of the relationship between the light quantity $L_1$ of the reflecting light (primary light) from the original toward the portion of the web 24 and the reflectivity $\beta$ of the resting surface of the table 18a, as viewed from a direction indicated by an arrow IV in FIG. 3. The reflectivity $\beta$ is so determined as to uniformize the the sum of the light quantity $L_1$ and the light quantity $L_2$ of the reflecting light (secondary light) from the resting surface of the table 18a. In general, in case where an image is focused by a lens system, because of the cosine fourth-power law and the vignetting factor, such a light quantity distribution is produced that a central region of the image on an optical axis of the lens system is most bright, and the longer the distance from the central region toward a peripheral region of the image, the darker the image. By this reason, the light quantity distribution in the illustrated embodiment is brought to a curve indicated by m in FIG. 4.

On the basis of calculation results to be described later, it is ascertained that the distribution curve of the reflectivity $\beta$ of the resting surface of the table 18a, which corresponds to the light quantity distribution curve m, is brought to a curve n indicated by the broken line in FIG. 4, in order to bring a light quantity $L(x)=L$ to a constant value subsequently to be described. In the curve n indicated by the broken line, the reflectivity $\beta$ increases from a central region gradually toward opposite end regions.

It is assumed, here, that the distance from the center of the resting surface of the table 18a toward each of the opposite ends thereof is x, the transmittance of the web 24 is $\alpha$, the reflectivity of the resting surface is $\beta(x)$, and the light quantity of the reflecting light (primary light) from the original is $L_1(x)$. Then, the light quantity $L_2(x)$ of the reflecting light (secondary light) from the resting surface, with which the web 24 is again illuminated, is expressed by the following equation:

$$L_2(x) = L_1(x) \times \alpha \times \beta(x)$$

Further, the light quantity $L(x)$, with which the web 24 is illuminated from both the front and back sides thereof in order to cure the microcapsules per se thereon, is expressed by the following equation:

$$L(x) = L_1(x) + \alpha \cdot L_2(x)$$

Therefore, $$L(x) = L_1(x) \cdot (1 + \alpha^2 \cdot \beta(x))$$

Here, if the light quantity $L(x) = L =$ constant, $$\beta(x) = 1/\alpha^2 (L/L_1(x) - 1) \qquad (1)$$

That is,
is $L_1(x) \rightarrow$ large, $\beta(x) \rightarrow$ small, and
if $L_1(x) \rightarrow$ small, $\beta(x) \rightarrow$ large.

In this connection, in order to prevent deterioration of the resolution, it is required that the web 24 is in close contact with the resting surface of the table 18a. If the web 24 is in close contact with the resting surface, the resting surface is not required to be formed by a mirror surface. The magnitude of the reflectivity $\beta(x)$ may be replaced by a difference in brightness (white⇌black).

Further, if the primary light is limited to a case where the primary light shines upon the front side of the web 24, the reflectivity $\beta(x)$ is varied in accordance with the above equation (1), whereby the invention can be carried into practice even if the light quantity distribution $L_1(x)$ of the primary light takes any form, and even if the primary light is not the reflecting light from the original, but is light transmitted through the original.

Furthermore, in case where the primary light shines upon the web 24 from the back side thereof, the above equation (1) is replaced by the following equation:

$$\beta(x) = 1/\alpha(L/L_1(x) - \alpha) \qquad (1')$$

If the reflectivity $\beta(x)$ is varied in accordance with the equation (1'), the invention can be carried into practice, similarly to the previous case.

It is to be understood that although the invention has been described on the basis of the slit exposure, the invention is apparently carried into practice also for stationary exposure in which exposure is performed while the original and the recording medium are maintained stationary.

Further, the recording medium is not necessarily required to be a photo-sensitive paper, but may be a photo-sensitive film, for example. Any other suitable recording medium is applicable to the exposure system according to the invention, if light is substantially transmitted through the recording medium, or light is diffusedly transmitted through the recording medium.

As described above in detail, the arrangement of the exposure system according to the invention is such that the reflectivities of the respective positions on the resting surface of the table are so varied as to increase from the central region of the resting surface gradually toward the opposite end regions thereof, correspondingly to the deviation in the light quantity of the light (primary light) from the light source exposing the recording medium. With such arrangement, only the table enables the light quantity distribution to be corrected and also enables the light quantity to be utilized effectively. Thus, the number of component parts in the exposure system can be reduced as compared with the conventional exposure system discussed previously, making it possible to reduce the cost. Further, waste in the light quantity can be avoided unlike the conventional correction of the light quantity distribution due to the slit, making it possible to utilize the light quantity more effectively.

What is claimed is:

1. An exposure system for a photo-sensitive recording medium, which comprises light source means for emitting light and table means having a resting surface on which the recording medium rests, wherein the recording medium on said resting surface of said table means is illuminated with the light from said light source means and is exposed to the light, and wherein said resting surface of said table means has reflectivity which is so determined as to increase from a central region of said resting surface gradually toward opposite end regions thereof in such a manner that a sum of a quantity of the light from said light source means, with which the recording medium is illuminated directly, and a quantity of light transmitted through the recording medium and reflected by said resting surface of said table means, with which the recording medium is illuminated indirectly, is made substantially uniform over an entire surface of the recording medium.

2. The exposure system according to claim 1, wherein said resting surface of said table means is formed into a mirror surface.

3. The exposure system according to claim 1, wherein said resting surface of said table means is formed into a white surface.

4. An image recording apparatus utilizing a photo-sensitive recording medium, which comprises:
original support means for supporting an original having carried thereon image information;
an exposure system including light source means for emitting light to shine upon the original, table means arranged at an exposure station and having a resting surface on which the recording medium rests, and optical means for directing the light reflected from the original, toward the recording medium on said resting surface of said table means to expose the recording medium to the light thereby forming a latent image onto the recording medium, the latent image corresponding to the image information on the original; and
means for developing the latent image on the recording medium,
wherein said resting surface of said table means has reflectivity which is so determined as to increase from a central region of said resting surface gradually toward opposite end regions thereof in such a manner that a sum of a quantity of the reflecting light from said original, with which the recording medium is illuminated directly, and a quantity of light transmitted through the recording medium and reflected by said resting surface of said table means, with which the recording medium is illuminated indirectly, is made substantially uniform over an entire surface of the recording medium.

5. The image recording apparatus according to claim 4, wherein said resting surface of said table means is formed into a mirror surface.

6. The image recording apparatus according to claim 4, wherein said resting surface of said table means is formed into a white surface.

7. The image recording apparatus according to claim 4, wherein said light source means is stationary and shines upon a predetermined line on the original supported by said original support means, while said original support means is movable in such a manner that the original passes successively over said predetermined line.

8. The image recording apparatus according to claim 4, wherein the recording medium includes a continuous web coated with microcapsules each containing dye precursor.

9. An image apparatus utilizing a photo-sensitive recording medium, which comprises:
original support means for supporting an original having carried thereon image information;
an exposure system including light source means for emitting light to shine upon the original, table means arranged at an exposure station and having a resting surface on which the recording medium rests, and optical means for directing the light reflected from the original, toward the recording medium on said resting surface of said table means, wherein the recording medium is exposed to the reflecting light from the original and to light transmitted through the recording medium and reflected by said resting surface of said table means, whereby a latent image corresponding to the image information on the original is formed onto the recording medium; and
means for developing the latent image on the recording medium,
wherein when it is assumed that transmittance of the recording medium is $\alpha$, reflectivity of said resting surface of said table means is $\beta(x)$, and a quantity of the reflecting light from the original, with which the recording medium is illuminated directly, is $L_1$, the following relationship exists:

$$\beta(x) = 1/\alpha^2 (L/L_1(x) - 1)$$

where L represents a sum of said $L_1$ and a quantity of the reflecting light from said resting surface, with which the recording medium is said $L_1$ and a quantity of the reflecting light from said resting surface, with which the recording medium is illuminated indirectly, said L being constant, and x represents distance from a center of the recording medium toward each of opposite ends thereof.

10. The image recording apparatus according to claim 9, wherein said resting surface of said table means is formed into a mirror surface.

11. The image recording apparatus according to claim 9, wherein said resting surface of said table means is formed into a white surface.

12. The image recording apparatus according to claim 9, wherein said light source means is stationary and shines upon a predetermined line on the original supported by said original support means, while said original support means is moveable in such a manner that the original passes successively over said predetermined line.

13. The image recording apparatus according to claim 9, wherein the recording medium includes a continuous web coated with microcapsules each containing dye precursor.

* * * * *